United States Patent [19]

Narabu et al.

[11] Patent Number: 4,660,176
[45] Date of Patent: Apr. 21, 1987

[54] DIGITAL MEMORY MEANS WITH AN ACCURATE REFERENCE SIGNAL

[75] Inventors: Tadakuni Narabu; Maki Sato, both of Kanagawa, Japan

[73] Assignee: Sony Corporation, Tokyo, Japan

[21] Appl. No.: 482,765

[22] Filed: Apr. 7, 1983

[30] Foreign Application Priority Data

Apr. 13, 1982 [JP] Japan ................... 57-60301

[51] Int. Cl.[4] ............................................ G11C 11/34
[52] U.S. Cl. ..................................... 365/183; 377/63
[58] Field of Search .................... 365/183, 45, 222; 357/24; 377/62, 63

[56] References Cited

U.S. PATENT DOCUMENTS 4,007,381  2/1977  Mohsen .
4,143,285  3/1979  White .
4,322,819  3/1982  Hyatt .................................. 365/222

FOREIGN PATENT DOCUMENTS 2843410  4/1980  Fed. Rep. of Germany .
2052203  1/1981  United Kingdom .

Primary Examiner—James W. Moffitt
Attorney, Agent, or Firm—Lewis H. Eslinger; Alvin Sinderbrand

[57] ABSTRACT

A digital memory comprises a charge coupled device (CCD) that includes a reference signal storage section. The digital input to the CCD includes an input reference signal and an information signal having a plurality of data levels, for example, a digital "0" and "1". The input reference signal includes a reference bit at the higher data level. The reference signal storage section divides the level of the reference bit to provide a reference level signal halfway between the two data levels. Thus, any shift in the data levels due, for example, to temperature changes in the CCD, affects the reference level signal to the same degree and the reference level can be kept exactly halfway between the data levels.

10 Claims, 12 Drawing Figures

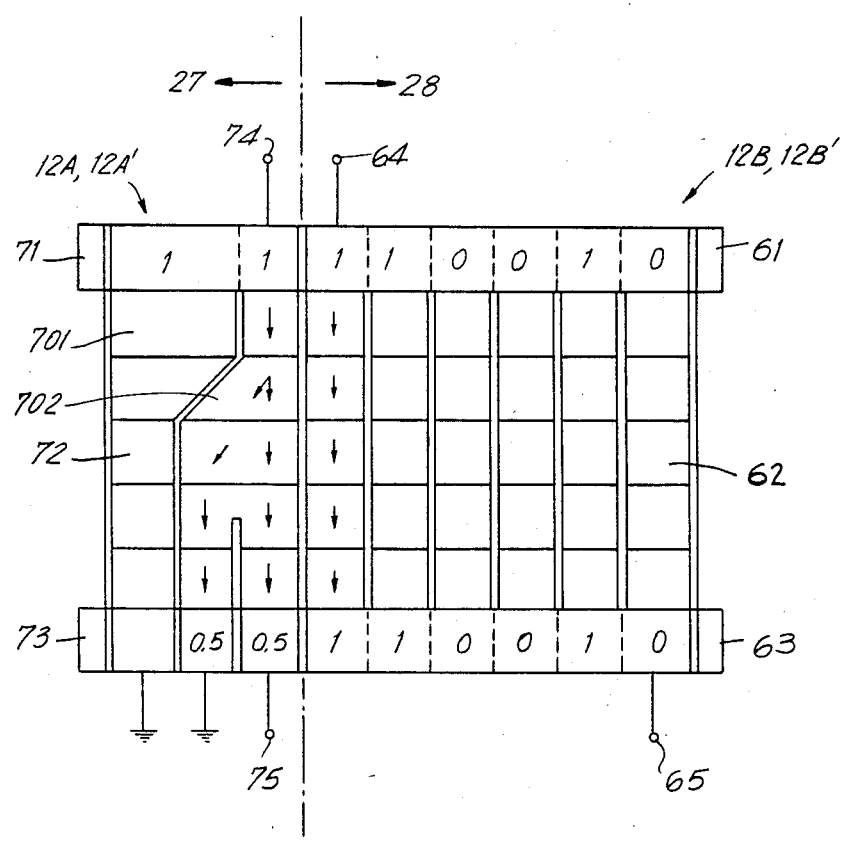
FIG. II

DIGITAL MEMORY MEANS WITH AN ACCURATE REFERENCE SIGNAL

BACKGROUND OF THE INVENTION

1. Field of the Invention

The present invention relates to a digital memory and, more particularly, to such a memory having an accurate reference signal.

2. Background of the Invention

Solid-state digital memories using charge transfer devices, such as CCD's (charge coupled devices), BBD's (bucket brigade devices) and MOS's (metal oxide semiconductor devices), are well known in the art. To read out such memories, a reference level signal is provided. Output data at a level above the reference level is read out as one type of data (for example, a digital "1") and at a level below the reference as another type of data (for example, a digital "0").

The output data obtained from such memories will match the input data only to the extent that the reference level is precisely controlled relative to the levels of the data. When operating conditions, such as the temperature of the memory device, change, the levels of the data can shift. When that happens, the reference level no longer has the same relation to the data levels and bit errors can occur in the output of the memory.

OBJECTS AND SUMMARY OF THE INVENTION

It is an object of the present invention to overcome the above-described deficiencies in prior art digital memories.

It is another object of the present invention to provide a digital memory in which shifts in the levels of the output from the memory will not cause bit errors.

In accordance with an aspect of the present invention, a digital memory comprises information storage means for storing digital information having a plurality of data levels and providing said digital information to sensing means after storing it for a predetermined time and reference signal storage means for accepting an input reference signal and providing reference level signal having a level between the data levels and being forwarded to the sensing means a predetermined time after accepting the input reference signal for use by the sensing means to distinguish between the data levels. The reference signal storage means is maintained at operating conditions relative to the information storage means, for example, by being constituted by respective portions of the same charge transfer device, so that the level of the reference level signal relative to the data levels remains substantially constant.

The above and other objects, features and advantages of the present invention will be apparent from the following detailed description of illustrative embodiments, which is to be taken in connection with the accompanying drawings.

BRIEF DESCRIPTION OF THE DRAWINGS

FIG. 11 illustrates a charge coupled device suitable for use as a digital memory means in the memory circuits shown in FIGS. 9 and 10.

DETAILED DESCRIPTION OF ILLUSTRATIVE EMBODIMENTS

The advantages and operation of the present invention will be better and more easily understood by considering first the problems associated with prior art digital memories when an operating condition, such as temperature, fluctuates.

Figure 1:
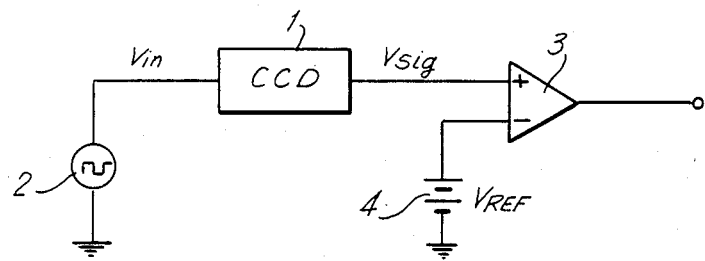
FIGS. 1, 2A and 2B illustrate a prior art digital memory and how differences in operating temperatures of the charge transfer device used in the memory can cause bit errors in the output thereof.

FIG. 1 shows a prior art digital memory circuit in which a CCD 1 receives an information signal $V_{in}$ from a data source 2. The CCD 1 provides an output signal $V_{sig}$ a predetermined time after the input signal is received. The output signal $V_{sig}$ is applied to an input of a sense amplifier 3. A reference signal $V_{REF}$ from a reference signal generator 4 is applied to another input of the sense amplifier 3. In a well known manner, if the level of $V_{sig}$ is below $V_{REF}$, the sense amplifier 3 provides an output corresponding to a digital "0" and if the level of $V_{sig}$ is above $V_{REF}$, the sense amplifier provides an output corresponding to a digital "1". Thus, the digital data at the output of the sense amplifier 3 is the same as that provided by the source 2. U.S. Pat. Nos. 3,654,499, 3,789,247 and 4,010,485 show examples of such devices.

Figure 2A:
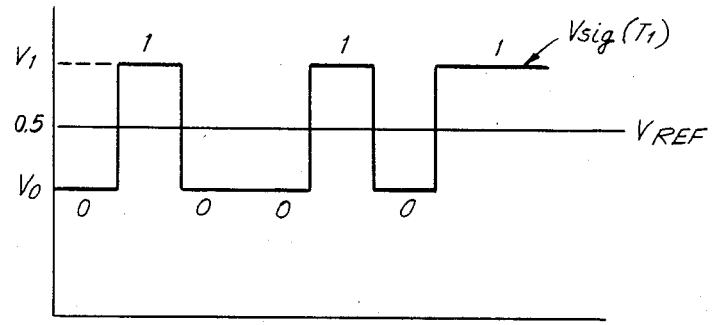
Figure 2B:
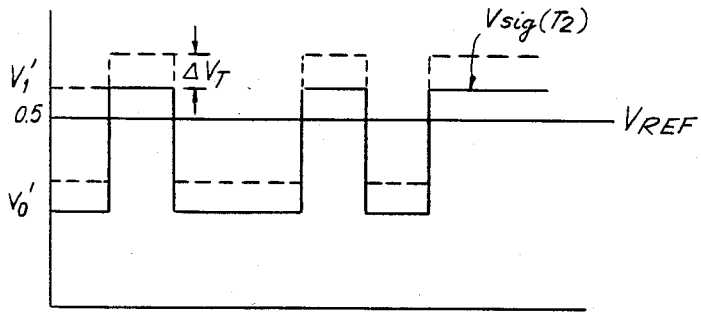

At its design temperature $T_1$, the charge coupled device 1 operates as shown in FIG. 2A. The data signal $V_{sig}(T_1)$ has a particular upper level $V_1$ and lower level $V_0$. $V_{REF}$ is chosen to be initially at a level halfway between $V_0$ and $V_1$. $V_{REF}$ thus allows the sense amplifier 3 to distinguish easily between $V_0$ and $V_1$ and supply a digital signal that contains the same information as the input signal. However, at a different temperature $T_2$, the levels of $V_{sig}$ can shift as illustrated in FIG. 2B so that it is no longer a level halfway between $V_0$ and $V_1$. In that case the upper level $V'_1$ of the output signal $V_{sig}(T_2)$ can be lower than $V_{sig}(T_1)$ by an amount $\Delta V_T$. The difference between $V_{REF}$ and $V'_1$ in that event may not be sufficient for the sense amplifier 3 reliably to provide the correct digital output.

Figure 3:
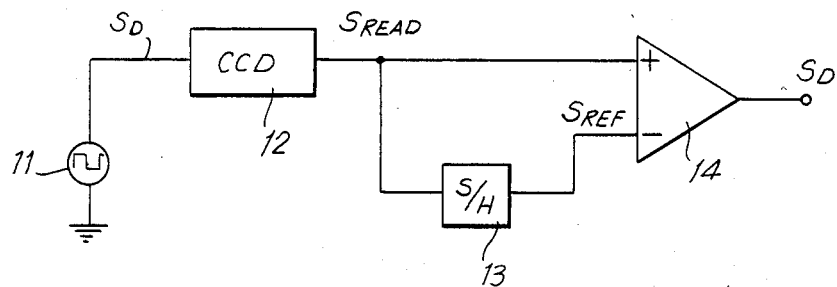
FIG. 3 illustrates a memory circuit incorporating a digital memory means in accordance with one embodiment of the present invention.
Figure 4:
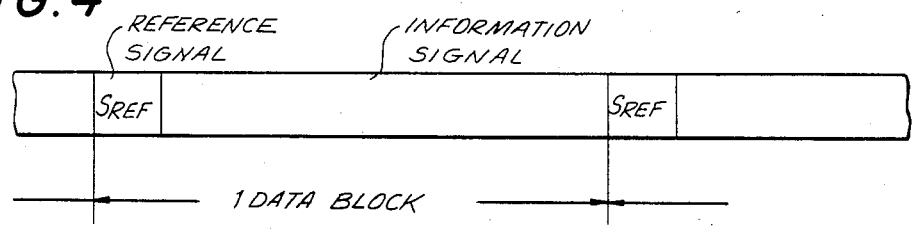
FIG. 4 illustrates the data from the digital memory means of FIG. 3.

The present invention overcomes that problem. FIG. 3 illustrates the principle by which a digital memory in accordance with the present invention operates. In the embodiment shown in FIG. 3 a digital information signal $S_D$ from a suitable digital data source 11 is provided to a CCD 12. The information is arranged in a plurality of data blocks, each of which has a reference signal block associated with it, the purpose of which is described below. The data is provided to the CCD 12. The output $S_{READ}$, represented in FIG. 4, from the CCD 12 is provided to a sample and hold circuit 13 and to one of the inputs of a sense amplifier 14. The sample and hold circuit 13 and the sense amplifier 14 are of conventional construction, and the details thereof are known to those skilled in the art. In any case, the sample and hold circuit 13, using a clocking signal (not shown), samples and holds the reference signal $S_{REF}$, which has a level halfway between the data levels by virtue of the construction of CCD 12, and supplies it to another input of the sense amplifier 14 to be used as the reference signal for the digital information in the data block with which it is associated. The digital signal $S_D$ from the sense amplifier 14 thus reliably represents the digital information in the input signal because the reference signal has been passed through the charge transfer device 12 and, like the information signal, is subject to any level shifting that may have occurred.

Figure 5:
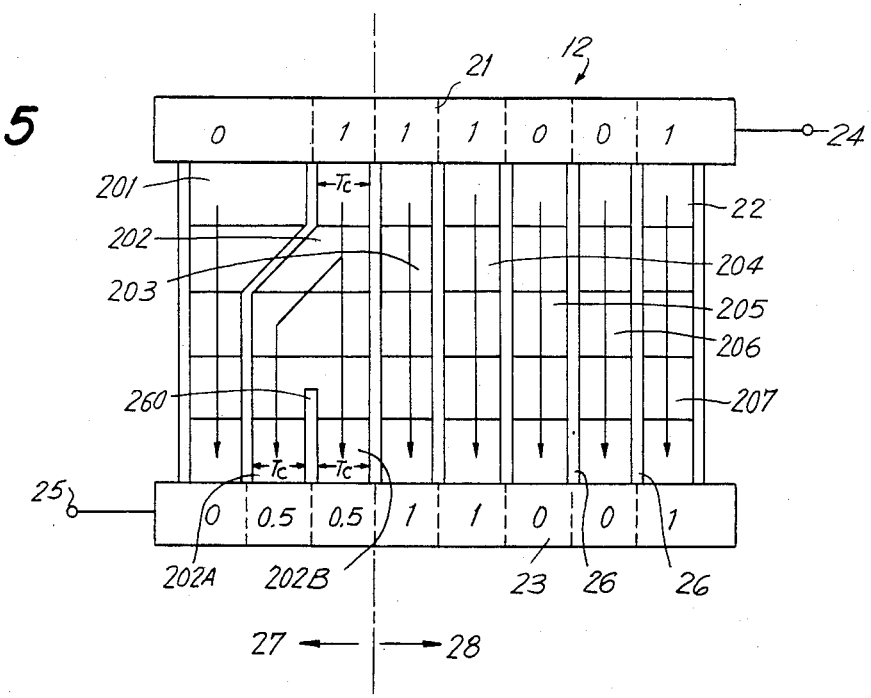
FIG. 5 illustrates an embodiment of a charge coupled device that can be used as the digital memory means in the memory circuit shown in FIG. 3.

FIG. 5 schematically depicts the CCD 12 shown in FIG. 3 and illustrates further the operation and advantages of the present invention. The CCD 12 comprises a serial input register 21, a data transfer region 22 and a serial output register 23. The input register 21 has an input terminal 24 and the output register has an output terminal 25. The transfer region 22 comprises a plurality of parallel transfer channels 201, 202, 203, 204, 205, 206 and 207 corresponding in number to the number of data bits in each input data block. (In practice, the number of transfer channels is greater than that shown here, but the number of channels has been reduced to facilitate a description of the present invention.) Each transfer channel has a nominal channel width $T_c$ and is separated from adjacent channels by channel stoppers 26.

The input register 21 comprises a serial-to-parallel register for accepting a data block and arranging it so that each bit is transferred in parallel fashion to one of the transfer channels 201, 202, 203, etc. The output register comprises a parallel-to-serial register for converting the data from the transfer region 22 into the data blocks shown in FIG. 4.

The two transfer channels 201 and 202 comprise reference signal storage means 27 that transfer the reference signal, while the remaining channels comprise information storage means 28 that transfer the information signal. The first transfer channel 201 comprises a buffer channel that receives a buffer bit, preferably at the lower data level, that is transferred unchanged through the first transfer channel 201. The second transfer channel 202 comprises a divider channel that receives an input reference signal, in this case a reference bit at the higher data level. The channel width at the input side of the divider channel 202 is $T_c$. At the output side of the divider channel 202, an extra channel stopper 260 is provided to form, for the reference bit, at the output of the divider channel 202, two output channels 202A and 202B. Each of the output channels 202A and 202B have the same width as the other transfer channels, namely $T_c$. The offset voltage of the CCD 12 is chosen so that it is the same as the lower data level, say $V_0$. Thus, the level of the output reference level signal at the output channels 202A and 202B is $V_0+(V_1-V_0)/2$, where $V_1=$the higher data level. Thus, the output channels 202A and 202B both provide a reference level bit at a level halfway between the higher and the lower data levels.

The information storage means 28 operates like a conventional CCD, transferring the bits in the information signal unchanged through the CCD 12. The transfer of the bits by the reference storage means 27 and the information storage means 28 is depicted in FIG. 5. The level of one of the reference level bits of the output channels 202A and 202B is sampled and held by the sample and hold circuit 13 for use as the reference level. The buffer bit prevents interference from affecting the level of the reference signal.

The present invention thus eliminates the effect of level-shifting caused by temperature differences, for example, because both the reference level and the levels of the information signal are subjected to identical shifts. Furthermore, with the present invention the need for precise control of the reference level, to ensure that it is exactly halfway between the two data levels, is eliminated. The input reference signal merely has to be supplied at the same level as the upper data level.

Figure 6:
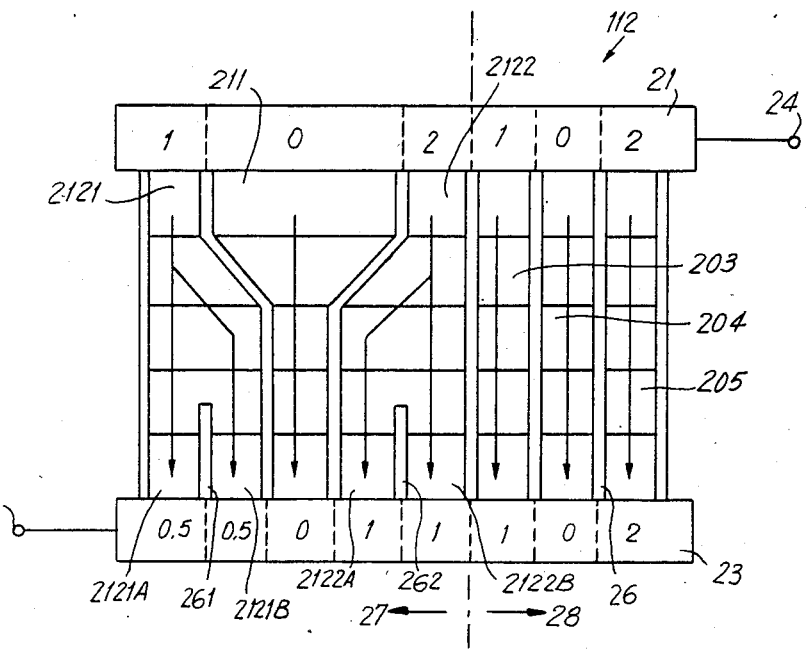
FIG. 6 illustrates an alternate embodiment of the charge coupled device shown in FIG. 5 for use with digital data having three levels.

FIG. 6 illustrates an alternate embodiment of the charge coupled device 12 shown in FIG. 3. The CCD 112 shown in FIG. 6 is suitable for use with a data provided at three levels, for example, a digital "0", "1" and "2". The parallel transfer channels 203, 204, etc., comprising the information storage means are substantially identical to those of the CCD 12 shown in FIG. 5. However, in the CCD 112 shown in FIG. 6, the buffer channel 211 is disposed between two divider channels 2121 and 2122. At the input side of each of the divider channels 2121 and 2122, the channel width is identical to the nominal channel width $T_c$. At its output side the first divider channel 2121 is divided by a channel stopper 261 into two first divider output channels 2121A and 2121B each of which has a channel width $T_c$. The second divider channel 2122 has a similar configuration. At its input side its channel width is $T_c$. At its output side a channel stopper 262 divides it into two second divider output channels 2122A and 2122B, both of which have a channel width $T_c$.

In operation, a first input reference signal, comprising a reference bit at a level corresponding to one of the higher data levels, for example, the level corresponding to a digital "1", is provided to the first divider channel 2121. That bit is divided into two bits, each of which has a level corresponding to a level halfway between the lowest data level and the level corresponding to a digital "1", and each of which appear at the first divider output channels 2121A and 2121B. The operation of the divider channel 2121 is thus similar to the operation of the divider channel 202 in the CCD 12. A second input reference signal, this one comprising a bit at the level of the highest data level, a digital "2", is provided to the second divider channel 2122. It is divided at the second divider output channels 2122A and 2122B into two bits, each of which has a level corresponding to a level halfway between the lowest data level and the level corresponding to a digital "2". If the offset voltage of the CCD 112 is chosen as $V_0$, the level of each second output reference signal is $V_0+(V_2-V_0)/2$, where $V_2$ is the highest data level. If $\Delta V$ is the difference between data levels, then $V_0+(V_2-V)/2=V_0+\Delta V$, which is the level $V_1$ of the first data level.

Thus, two reference level signals are provided that can be separated from the information data by sample and hold circuitry and provided to sensing means, as will be apparent to those skilled in the art. One of the first reference level bits, say at the output of the first output divider channel 2121A, can be used to distinguish between a digital "0" and "1". The other first reference level bit, at the other first output divider channel 2121B, can be combined with one of the second reference level bits at the second output divider channel 2122A or 2122B to distinguish between a digital "1" and "2".

Figure 7:
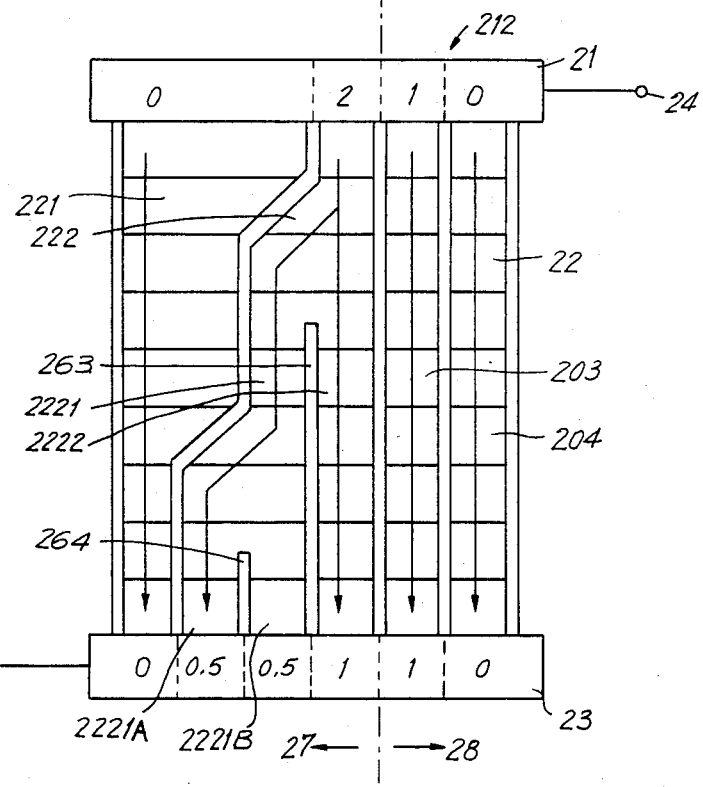
FIG. 7 illustrates an alternate embodiment of the charge coupled device shown in FIG. 6.

FIG. 7 illustrates a CCD 212 that represents an alternate embodiment of the CCD 112 shown in FIG. 6. In the embodiment shown in FIG. 7, a buffer channel 221 is provided with a buffer bit. A divider channel 222, having a width $T_c$ is provided with an input reference signal comprising a bit at the highest data level. The divider channel 222 is then divided by two channel stoppers 263 and 264. The first channel stopper 263 divides the divider channel 222 into two intermediate divider channels 2221 and 2222, each of which has a width $T_c$, so that each intermediate divider channel 2211 and 2222 transfers a data bit at the middle data level. One of the intermediate divider channels is divided by the channel stopper 264 into a pair of final divider channels 2221A, and 2221B, each having a width $T_c$. Thus, the intermediate reference level bit at the output of the intermediate divider channel 2222 and a final reference level bit at the output of one of the final divider channels 2221A or 2221B can be combined, as described above in connection with the embodiment shown in FIG. 6, to provide the reference signal for differentiating between the "1" and "2" data levels. The final reference level bit at the output of the other final divider channel 2221B can be used to differentiate between the "0" and "1" data levels. The CCD 222 has the advantage over the CCD 212 that only one input reference signal need be supplied to provide both reference level signals.

Figure 8:
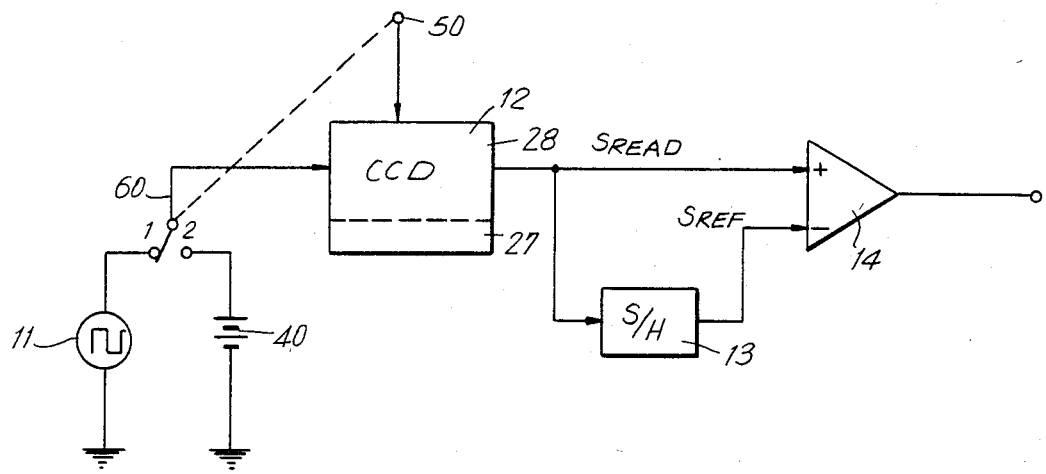
FIG. 8 illustrates in more detail the operation of the memory circuit shown in FIG. 3.

FIG. 8 illustrates in more detail the operation of the memory shown in FIG. 3. A reference signal generator 40 is provided to generate an input reference signal at the proper level. A clock 50 operates the CCD 12 and a switch 60. Suitable circuitry is provided so that the data applied to the CCD 12 is arranged in data blocks comprising digital information from the data source 11 and a reference section including an input reference signal and suitable buffer bits. The clock 50 also operates the sample and hold circuit 13, as described above, so that the reference level signal $S_{REF}$ is applied to the sense amplifier 14.

Figure 9:
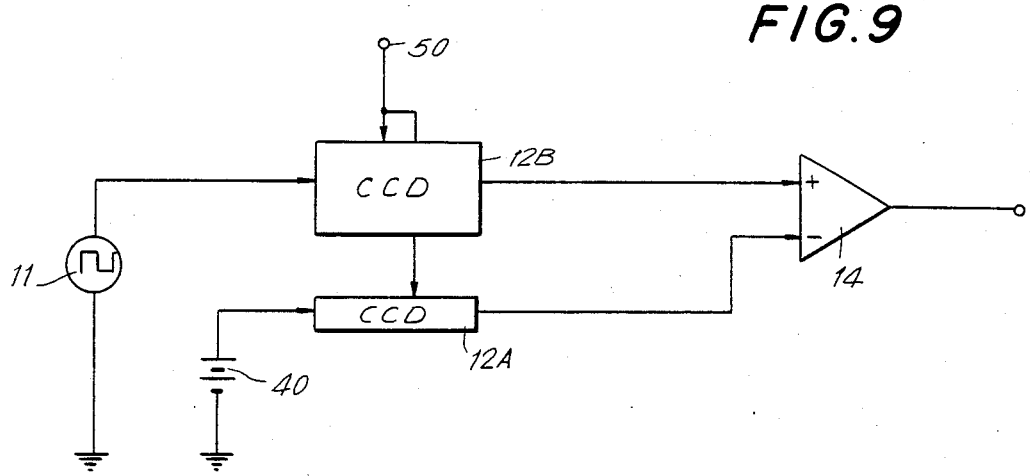
FIGS. 9 and 10 illustrate alternate embodiments of memory circuits in accordance with the present invention.
Figure 10:
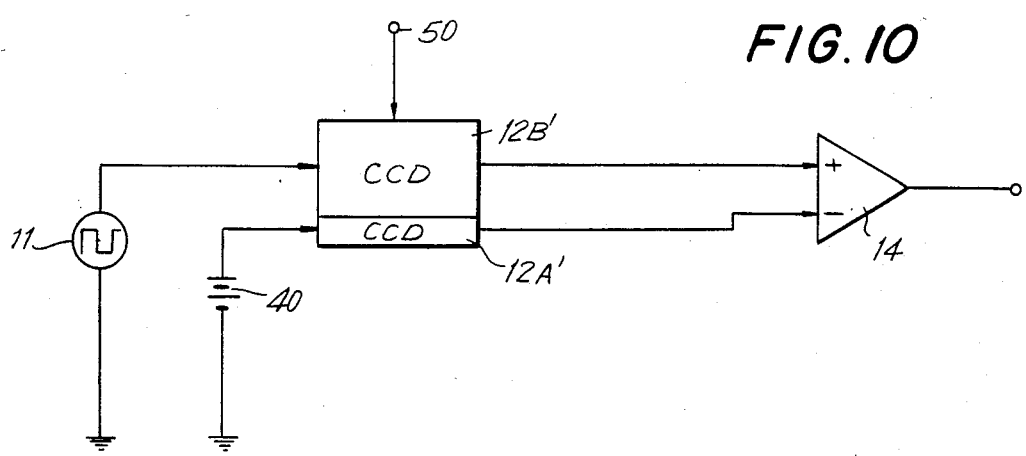

FIGS. 9 and 10 illustrate alternate embodiments of memory circuits in accordance with the present invention. In FIG. 9 a reference signal generator 40 provides a reference signal to a CCD 12A that comprises the reference signal storage means. Another CCD 12B, comprising the information storage means, receives data from the data source 11. The level or levels of the input reference signal will depend, in accordance with the foregoing discussion, on the levels of the data information signal. The CCD 12B is similar to the charge coupled device 1 of the prior art. The CCD 12A divides the reference signal as described above. A clock 50 is provided for synchronizing the operation of the CCD 12A and the CCD 12B. The CCD's 12A and 12B are maintained in the same operating environment and thus any level shifting in the information signal will also occur in the reference level signal. The embodiment shown in FIG. 9 can be used with a reference signal storage means formed on a different semiconductor substrate and enables adaptation of a prior art memory for use with the present invention.

FIG. 10 discloses an alternate embodiment of the digital memory shown in FIG. 9. The operation of the digital memory in FIG. 10 is identical to that in FIG. 9. However, in FIG. 10, the CCD 12A' and the CCD 12B' are formed on the same substrate.

FIG. 11 illustrates the operation of the CCD's 12A and 12B, or 12A' and 12B'. The CCD 12B, 12B' comprise an input register 61, a data transfer region 62 and an output register 63. The input register 61 has an input terminal 64 and the output register has an output terminal 65. The input terminal 64 accepts the data from the source 11 and the output terminal provides the output data to the sense amplifier 14. The CCD 12B, 12B' comprises the information storage means 28. The CCD 12A, 12A' comprises a separate input register 71, having a separate input terminal 74 for accepting the input reference signal from the reference signal generator 40. The reference signal storage means 27 comprises the buffer channel 701, which in this illustration receives a buffer bit at the "1" level, and the divider channel 702. The output register 73 provides one of the reference level bits to the sense amplifier through the output terminal 75. The remaining reference level bit and the buffer bit are fed to ground.

Although various embodiments of the present invention have been discussed herein, those skilled in the art will recognize other modifications and embodiments of the present invention that can be made without departing from the spirit of the present invention. Therefore, the spirit and scope of the present invention are intended to be defined solely by the appended claims.

What is claimed is:

1. A digital memory comprising:
   information storage means for storing digital information having a plurality of data levels and providing said digital information to a sensing means after storing it for a predetermined time; and
   reference signal storage means for accepting an input reference signal and providing a reference level signal having a level between said data levels and being forwarded to the sensing means a predetermined time after accepting said input reference signal for use by the sensing means to distinguish between said data levels, said reference signal storage means being maintained at operating conditions relative to said information storage means such that said level of said reference level signal relative to said data levels remains substanially constant;
   said information storage means comprising a charge coupled device having a plurality of channels for transferring said information;
   said input reference signal having a level substanially the same as a higher data level; and
   said reference signal storage means comprising a charge coupled device having at least one divider channel for dividing said input reference signal to provide said reference level signal at a level halfway between two of said data levels.

2. A digital memory as in claim 1; wherein said information and said reference signal are stored for the same predetermined time and said information storage means and said reference signal storage means operate under similar conditions.

3. A digital memory as in claim 2; wherein
   said information and said input reference signal are arranged in data blocks comprising a reference section and an information section;
   said reference section includes at least one reference bit at one of the higher data levels of said information section; and
   said divider channel divides the level of said reference bit for providing a reference level bit with a level halfway between two of said data levels.

4. A digital memory as in claim 3; wherein said charge coupled device comprises an input register for serially accepting said information and said input reference signal, a plurality of channels for receiving said information and said reference signal and for the parallel transfer thereof, and an output register for serially arranging said information and said reference level signal received from said channels;

said reference signal storage means comprises a buffer channel for receiving said buffer bit from said input register; and said divider channel is arranged for receiving said reference bit and includes at least one output channel for providing said reference level bit to said output register.

5. A digital memory as in claim 4; further comprising a sample and hold circuit for sampling and holding said reference level signal from said output register, and a sense amplifier for accepting, at one input thereof, said sampled and held reference level signal and, at another input thereof, said information signal from said output register and using said reference level signal to distinguish between said data levels.

6. A digital memory as in claim 2; wherein said data is provided at two levels and said input reference signal is at the higher of said two data levels.

7. A digital memory as in claim 2; wherein
said data is provided at three equally spaced levels; and
said reference signal storage means comprises a first divider channel for accepting a first input reference signal at the middle data level and having two first divider output channels for dividing said first input reference signal and providing two first reference level signals having a level halfway between the lowest and middle of said three data levels, and a second divider channel for accepting a second input reference signal at the highest of said data levels and having a second divider output channel for dividing said second input reference signal and providing a second reference level signal at the middle data level.

8. A digital memory as in claim 2; wherein
said data is provided at three equally spaced levels;
said reference signal storage means comprises a divider channel for accepting an input reference signal at the highest of said data levels and having two intermediate divider channels for dividing said input reference signal and providing two intermediate reference level signals at the middle data level; and
one of said intermediate divider channels comprises two final divider channels for dividing one of said intermediate reference level signals and providing therefrom two final reference level signals at a level between the lowest and the middle data level.

9. A digital memory as in claim 2; wherein
said information storage means comprises an input register for accepting digital information from a source, a charge coupled device having a plurality of said channels for accepting said information from said input register and for the parallel transfer thereof and an output register for serially supplying the output of said channels to a sensing means; and
said reference storage means comprises an input register for accepting an input reference signal from a reference source, a charge coupled device including said divider channel for accepting said input reference signal from said input register, and an output register for supplying said reference level signal to a sensing means.

10. A digital memory as in claim 9; further comprising a reference signal source for generating said input reference signal.

* * * * *